United States Patent
Tseng

(10) Patent No.: US 6,684,034 B2
(45) Date of Patent: Jan. 27, 2004

(54) OPTICAL SIGNAL RECEIVING DEVICE

(76) Inventor: Chi Wang Tseng, 5F, No. 141-1, Cheng Kung Rd., Sanchung, Taipei Hsien (TW)

(*) Notice: Subject to any disclaimer, the term of this patent is extended or adjusted under 35 U.S.C. 154(b) by 580 days.

(21) Appl. No.: 09/750,080

(22) Filed: Dec. 29, 2000

(65) Prior Publication Data

US 2002/0085259 A1 Jul. 4, 2002

(51) Int. Cl.⁷ .................... H04B 10/00; H04B 10/06; H04B 10/10
(52) U.S. Cl. .................... 398/202; 398/212; 250/239; 250/216
(58) Field of Search ................. 398/202, 212; 250/239, 212

(56) References Cited

U.S. PATENT DOCUMENTS

| | | | | |
|---|---|---|---|---|
| 4,941,072 A | * | 7/1990 | Yasumoto et al. | 362/249 |
| 5,022,725 A | * | 6/1991 | Matsunami et al. | 359/726 |
| 5,032,960 A | * | 7/1991 | Katoh | 362/240 |
| 5,498,297 A | * | 3/1996 | O'Neill et al. | 136/246 |
| 5,505,789 A | * | 4/1996 | Fraas et al. | 136/246 |
| 5,602,384 A | * | 2/1997 | Nunogaki et al. | 250/203.4 |
| 5,633,498 A | * | 5/1997 | Savicki | 250/353 |
| 6,061,160 A | * | 5/2000 | Maruyama | 398/201 |
| 6,122,009 A | * | 9/2000 | Ueda | 348/335 |
| 6,246,045 B1 | * | 6/2001 | Morris et al. | 250/216 |
| 6,297,740 B1 | * | 10/2001 | Hill et al. | 340/600 |
| 6,348,684 B1 | * | 2/2002 | Nykolak et al. | 250/216 |
| 6,356,296 B1 | * | 3/2002 | Driscoll et al. | 348/36 |
| 6,417,500 B1 | * | 7/2002 | Wood | 250/203.4 |
| 6,455,774 B1 | * | 9/2002 | Webster | 174/52.4 |
| 6,455,927 B1 | * | 9/2002 | Glenn et al. | 257/686 |
| 6,483,101 B1 | * | 11/2002 | Webster | 250/216 |
| 6,521,882 B1 | * | 2/2003 | Sumiya et al. | 250/208.2 |
| 6,559,439 B1 | * | 5/2003 | Tsuchida et al. | 250/239 |

* cited by examiner

Primary Examiner—Jason Chan
Assistant Examiner—Agustin Bello
(74) Attorney, Agent, or Firm—Rosenberg, Klein & Lee

(57) ABSTRACT

An optical signal receiving device comprising a ring-shaped body, a control unit, an optoelectronic unit and a convex lens. The ring-shaped body has a receiving surface arranged on the outer surface thereof. The receiving surface has a first reflection surface and a second reflection surface on top surface and bottom surface thereof and parallel to each other. A bent block is formed on inner side of the ring-shaped body and a focusing surface is formed at distal end of the bent block. The control unit and the optoelectronic unit are arranged within the ring-shaped body and the convex lens is arranged atop the ring-shaped body. The light from top and lateral direction is guided by the convex lens and the ring-shaped body to the optoelectronic unit.

5 Claims, 3 Drawing Sheets

OPTICAL SIGNAL RECEIVING DEVICE

FIELD OF THE INVENTION

The present invention relates to an optical signal receiving device, especially to an optical signal receiving device with large detection range, thus increasing the detection efficiency thereof.

BACKGROUND OF THE INVENTION

The conventional infrared transmission system requires a light transmitting device and a light receiving device to achieve wireless transmission. However, the light receiving device is generally adopted a photodiode, which has small light reception angle and small detection range. Therefore, the light transmitting device should be aligned with the photodiode to ensure that the light emitted from the photodiode falls within the detection range of the light receiving device. In other word, the signal cannot be correctly transmitted when the light transmitting device is not located within the detectable range of the light receiving device, or the light transmitting device is not properly oriented with the light receiving device.

SUMMARY OF THE INVENTION

It is the object of the present invention to provide an optical signal receiving device with large detection range, thus increasing the detection efficiency thereof.

To achieve the above object, the optical signal receiving device according to the present invention comprises a ring-shaped body, a control unit, an optoelectronic unit and a convex lens. The control unit and the optoelectronic unit are arranged within the ring-shaped body and the convex lens is arranged atop the ring-shaped body. The light from top and lateral direction is guided by the convex lens and the ring-shaped body to the optoelectronic unit.

Moreover, the receiving surface has a lens around the outer circumference thereof to further enhance the light from lateral direction.

The various objects and advantages of the present invention will be more readily understood from the following detailed description when read in conjunction with the appended drawing, in which:

DETAILED DESCRIPTION OF THE INVENTION

Figure 1:
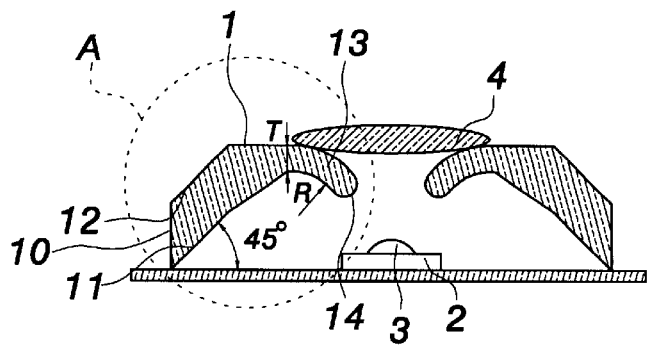
FIG. 1 shows the sectional view of the present invention.
Figure 1A:
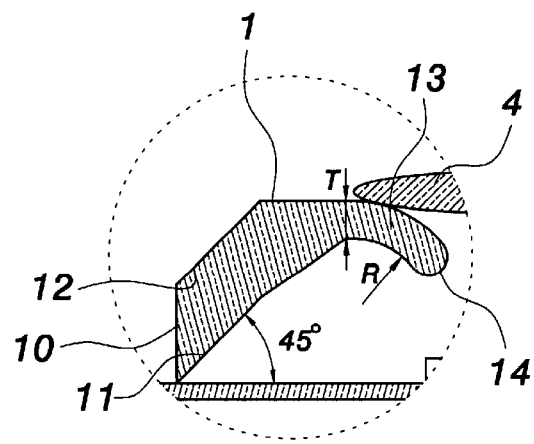
FIG. 1A is a partially enlarged view of part A in FIG. 1.
Figure 2:
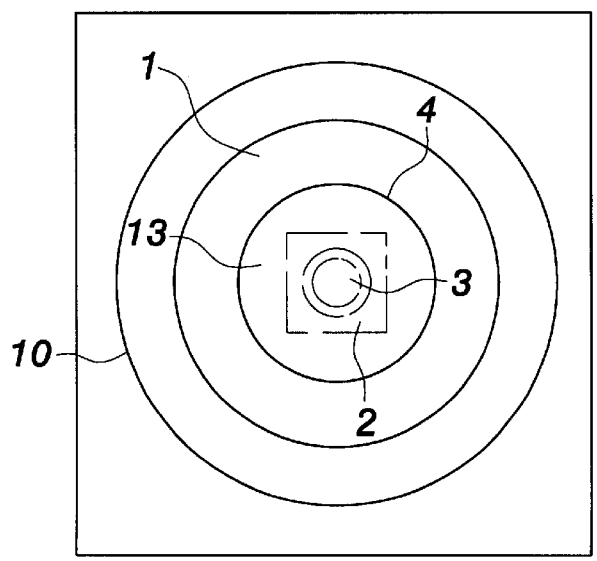
FIG. 2 shows the top view of the present invention.

FIG. 1 and FIG. 2 show the sectional view and top view of the present invention, respectively. As shown in those figures, the present invention is intended to provide photo signal receiving device comprising a ring-shaped body 1, a control unit 2, an optoelectronic unit (infrared diode) 3 and a convex lens 4. FIG. 1A shows the sectional view of the ring-shaped body 1 and the ring-shaped body 1 is centered at a vertical axis. The ring-shaped body 1 is made of materials transparent to the light emitted from the infrared diode 3. The ring-shaped body 1 has a receiving surface 10 vertically arranged on the outer surface of the ring-shaped body 1. Moreover, a first reflection surface 11 and a second reflection surface 12 on top surface and bottom surface of the ring-shaped body 1 and parallel to each other. The first reflection surface 11 and the second reflection surface 12 are inclined 45° to the horizontal plane. Moreover, a bent block 13 is formed on inner side of the ring-shaped body 1 and a focusing surface 14 is formed at distal end of the bent block 13. The thickness of the bent block 13 is T, and the radius of curvature of the inner wall of the bent block 13 is R. The radius of curvature R and thickness T have the relationship: $R \geq 2T$.

The control unit 2 and the optoelectronic unit 3 are arranged within the ring-shaped body 1 and are located at center of the ring-shaped body 1. The optoelectronic unit 3 is located atop the control unit 2 and the optoelectronic unit 3 converts its received light to electrical signal and then sends to the control unit 2. The convex lens 4 is arranged atop and at center of the ring-shaped body 1 such that the optoelectronic unit 3 is located at focal point of the focusing surface 14 and the focal point of the convex lens 4.

Figure 3:
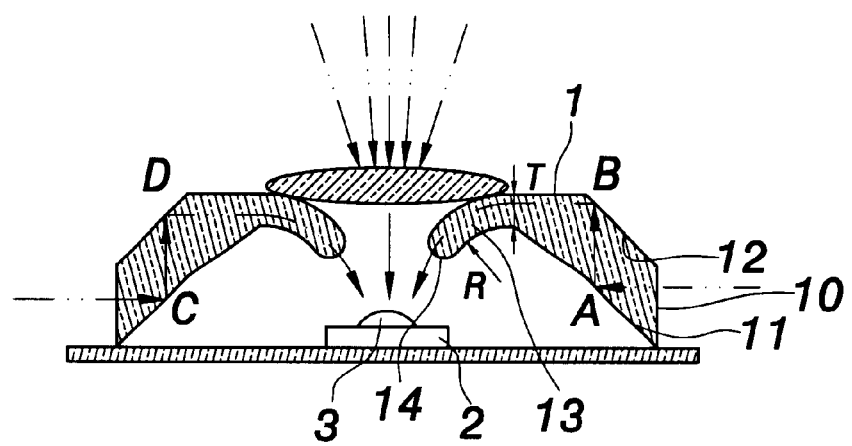
FIG. 3 is a side view showing the invention receiving light.
Figure 4:
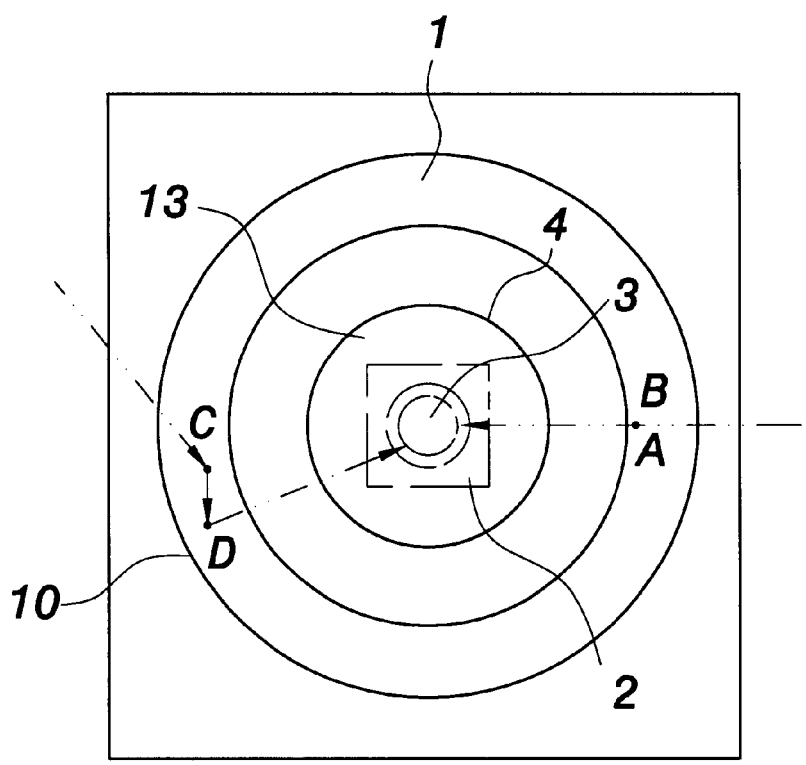
FIG. 4 is a top view showing the invention receiving light.

With reference to FIGS. 3 and 4, when the signal light is impinged into the photo receiving device from right direction (see the signal light on the right side of the FIGS. 3 and 4) and the signal light is higher than the optoelectronic unit 3, the light firstly passes through the receiving surface 10 and reaches point A on the first reflection surface 11. Because the incident angle is equal to the reflection angle, and the first reflection surface 11 and the second reflection surface 12 are inclined 45° to the horizontal plane and parallel to each other, the light is reflected from point A on the first reflection surface 11 and then propagates to point B on the second reflection surface 12. The light is then reflected from the point B and propagates into the bent block 13 of the ring-shaped body 1. Because the radius of curvature R and thickness T of the bent block 13 have the relationship: $R \geq 2T$, the light impinges into the bent block 13 is well guided by the bent block 13 and propagates along an arc path to the focusing surface 14. The optoelectronic unit 3 is located at the focal point of the focusing surface 14; the light is focused by focusing surface 14 and impinges toward the optoelectronic unit 3.

With reference to FIGS. 3 and 4 again, when the signal light is impinged into the photo receiving device from left direction (see the signal light on the left side of the FIGS. 3 and 4) and the signal light is still higher than the optoelectronic unit 3, similar to the previous situation, the light firstly passes through the receiving surface 10 and reaches point C on the first reflection surface 11. Afterward, the light is reflected to point D and then guided by the focusing surface 14 to the optoelectronic unit 3. In other word, the ring-shaped body 1 can collect the light from lateral circumference for the optoelectronic unit 3.

Moreover, the ring-shaped body 1 has a convex lens 4 on topside thereof. When the signal light comes from topside of the optoelectronic unit 3, as show in FIG. 3, the signal light is focused by the convex lens 4 and concentrates on the optoelectronic unit 3. Therefore, by the provision of the ring-shaped body 1 and the convex lens 4, the optoelectronic unit 3 can receive light of broad angle range. The detectable range of the optoelectronic unit 3 is increased.

Figure 5:
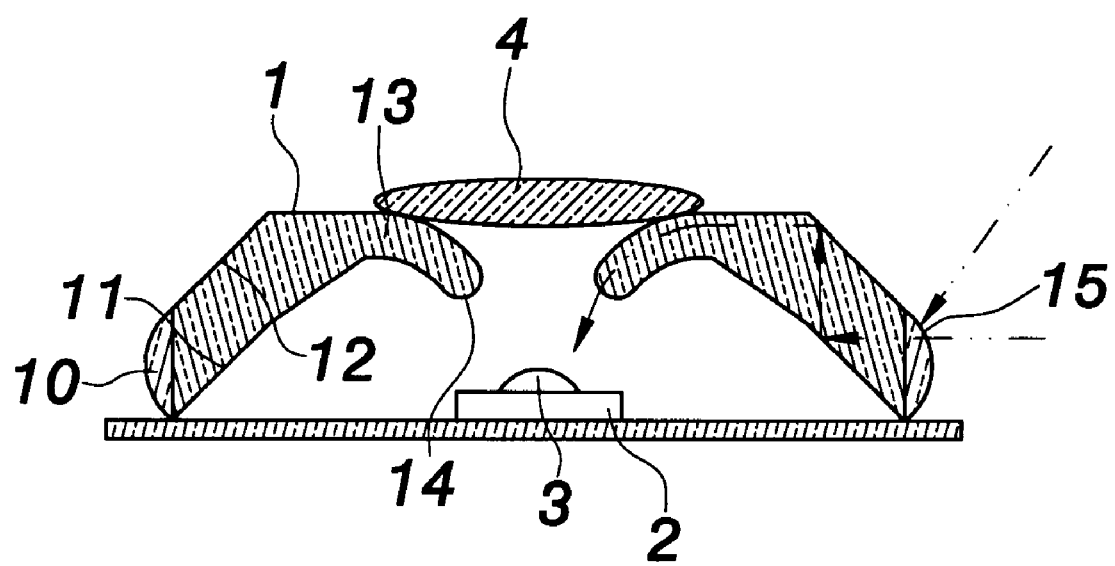
FIG. 5 is the sectional view of another preferred embodiment of the present invention.

Moreover, as shown in FIG. 5, the ring-shaped body 1 further comprises a lens 15 arranged on outer circumference of the receiving surface 10. The lens 15 can also collect the light toward the outer circumference of the receiving surface 10 and the light will reach the optoelectronic unit 3 through the ring-shaped body 1.

To sum up, the inventive optical signal receiving device utilize the convex lens 4 to collect light from topside and lens 15 on the receiving surface 10 to collect light from lateral circumference. Therefore, the optical signal receiving device has large detection range, thus increasing the detection efficiency thereof.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

I claim:

1. An optical signal receiving device comprising a ring-shaped body has a receiving surface arranged on the outer surface of the ring-shaped body; the receiving surface having a first reflection surface and a second reflection surface on top surface and bottom surface thereof and parallel to each other; the first reflection surface and the second reflection surface being inclined 45° to horizontal plane; a bent block formed on inner side of the ring-shaped body and a focusing surface formed at distal end of the bent block; the radius of curvature of the bent block being at least two times of the thickness of the bent block;

a control unit arranged within the ring-shaped body and at center of the ring-shaped body;

an optoelectronic unit arranged atop of the control unit; and a convex lens arranged atop the ring-shaped body.

2. The optical signal receiving device as in claim 1, wherein the ring-shaped body is made transparent material.

3. The optical signal receiving device as in claim 1, wherein the receiving surface has a lens around the outer circumference thereof.

4. The optical signal receiving device as in claim 1, wherein the optoelectronic unit is an infrared photodiode.

5. The optical signal receiving device as in claim 1, wherein the optoelectronic unit is located at the intersect point of the focal plane of the focusing surface and the convex lens.

* * * * *